(12) United States Patent
Wittich et al.

(10) Patent No.: US 11,795,542 B2
(45) Date of Patent: Oct. 24, 2023

(54) APPARATUS AND METHOD FOR COATING WORKPIECES

(71) Applicant: ALD VACUUM TECHNOLOGIES GMBH, Hanau (DE)

(72) Inventors: Jörg Wittich, Otzberg (DE); Simon Oberle, Erlenbach (DE); Jürgen Hotz, Münster (DE)

(73) Assignee: ALD VACUUM TECHNOLOGIES GMBH, Hanau (DE)

( * ) Notice: Subject to any disclaimer, the term of this patent is extended or adjusted under 35 U.S.C. 154(b) by 382 days.

(21) Appl. No.: 15/868,475

(22) Filed: Jan. 11, 2018

(65) Prior Publication Data

US 2018/0195165 A1    Jul. 12, 2018

(30) Foreign Application Priority Data

Jan. 12, 2017   (DE) .................. 10 2017 100 507.2

(51) Int. Cl.
*C23C 14/56*   (2006.01)
*C23C 14/30*   (2006.01)
*C23C 14/50*   (2006.01)
*F01D 5/28*    (2006.01)

(52) U.S. Cl.
CPC ............ *C23C 14/562* (2013.01); *C23C 14/30* (2013.01); *C23C 14/50* (2013.01); *C23C 14/505* (2013.01); *F01D 5/288* (2013.01); *F05D 2230/313* (2013.01); *F05D 2230/90* (2013.01)

(58) Field of Classification Search
None
See application file for complete search history.

(56) References Cited

U.S. PATENT DOCUMENTS

| 5,540,821 | A  | * | 7/1996 | Tepman ............ H01L 21/68785 |
| | | | | 204/192.12 |
| 5,733,096 | A  | * | 3/1998 | Van Doren ............ B25J 18/025 |
| | | | | 414/744.5 |
| 6,120,609 | A  | * | 9/2000 | Selyutin ............. C23C 16/4583 |
| | | | | 118/500 |
| 6,371,713 | B1 | * | 4/2002 | Nishimura ............. B25J 18/025 |
| | | | | 414/280 |
| 6,772,653 | B1 | * | 8/2004 | Franksson ............. E05F 15/622 |
| | | | | 74/89.36 |
| 2002/0047242 | A1 | * | 4/2002 | Watanabe ............ F16J 15/3236 |
| | | | | 277/553 |
| 2003/0197133 | A1 | * | 10/2003 | Turner .................... H01J 37/20 |
| | | | | 250/442.11 |
| 2005/0123386 | A1 | * | 6/2005 | Nishimura ............. H01L 21/681 |
| | | | | 414/222.01 |

(Continued)

FOREIGN PATENT DOCUMENTS

| CN | 102498346 A | 6/2012 |
| CN | 102534573 A | 7/2012 |

(Continued)

*Primary Examiner* — Jeffrie R Lund
*Assistant Examiner* — Tiffany Z Nuckols
(74) *Attorney, Agent, or Firm* — Barnes & Thornburg LLP; Ryan L. Marshall

(57) ABSTRACT

An apparatus and a method for coating workpieces with thermal barrier coatings. A manipulator shaft is guided here through a duct equipped with telescopic segments into the process chamber. The invention permits a particularly compact configuration of the plant.

8 Claims, 3 Drawing Sheets

(56) References Cited

U.S. PATENT DOCUMENTS

| | | | | |
|---|---|---|---|---|
| 2006/0281310 A1* | 12/2006 | Smith | ............... | H01L 21/68742 |
| | | | | 438/680 |
| 2007/0215049 A1* | 9/2007 | Aderhold | .......... | H01L 21/68707 |
| | | | | 118/728 |
| 2012/0064728 A1* | 3/2012 | Yi | ..................... | H01L 21/67196 |
| | | | | 438/758 |
| 2012/0304450 A1 | 12/2012 | Schrubke et al. | | |
| 2013/0113169 A1* | 5/2013 | Sugi | ................... | H01L 21/6831 |
| | | | | 279/128 |
| 2014/0290862 A1* | 10/2014 | Sugi | ................. | H01L 21/68792 |
| | | | | 156/345.51 |
| 2016/0293467 A1* | 10/2016 | Caveney | .......... | H01L 21/67173 |

FOREIGN PATENT DOCUMENTS

| | | |
|---|---|---|
| DE | 102012102465 A1 | 9/2013 |
| EP | 2157204 A1 | 2/2010 |
| EP | 2236643 A2 | 10/2010 |
| EP | 2374913 A1 | 10/2011 |
| EP | 2468918 A2 | 6/2012 |
| EP | 2520689 A1 | 11/2012 |
| EP | 1749116 B1 | 3/2015 |
| JP | 2000-180584 A | 6/2000 |
| RU | 2032765 C1 | 4/1995 |
| RU | 2476620 C1 | 2/2013 |

* cited by examiner

APPARATUS AND METHOD FOR COATING WORKPIECES

FIELD OF THE INVENTION

The present invention relates to an apparatus and a method for coating workpieces, in particular for coating turbine blades. The method is preferably a physical vapour deposition method (PVD), in particular an electron beam/physical vapour deposition method (EB/PVD). The coatings are in particular heat insulation layers which are also called thermal barrier coatings (TBC).

Turbine blades are subjected to very high temperatures and temperature gradients during operation. With the heat insulation layer, the heating resistance of the workpieces is increased and therefore the service life during operation is also extended. For the coating of turbine blades by means of EB/PVD, said turbine blades are introduced in particular into a vacuum atmosphere and are subsequently heated up in a preheating zone in order then to be coated in the process zone under vacuum and high temperature with defined movement profiles. This is undertaken with the aid of what is referred to as a manipulator. The region of the process zone is generally very hot, and dirt, in particular in the form of abrasive dust, arises. The requirements imposed on the material of the manipulator and of all of the other components in this region are therefore very exacting.

BACKGROUND OF THE INVENTION

Apparatuses and methods for coating turbine blades by means of EB/PVD methods are known in the prior art.

For example, EP 2 520 689 A1 teaches an EB/PVD apparatus and a method for coating workpieces. The apparatus has a manipulator which holds a workpiece in an extended position in a coating chamber and in a retracted position outside the coating chamber. The manipulator is provided with a heat hood which is pulled together with the workpiece out of the treatment chamber. The manipulator can have an outer part and an inner part. The inner part here is movable relative to the outer part. The inner part can hold the workpiece, and the outer part holds the heat hood. The inner part is rotatable relative to the outer part about the longitudinal axis of the manipulator. In addition to the coating chamber, the apparatus can have an introducing chamber and a preheating chamber. During the coating, the workpiece can be rotated. The design of the apparatus in this prior art document makes it necessary to provide seals in the treatment chamber (see FIG. 6, reference sign 332). It is disadvantageous to provide seals and movable parts of the apparatus in the treatment chamber, the region of the greatest temperature load and dust load, and therefore it is desirable to keep the number of such components as low as possible in this region. Overall, the apparatus in the cited document is of relatively complex design in the region of the treatment chamber, with the disadvantage that an increased outlay on maintenance occurs.

EP 2 157 204 A1 likewise teaches a coating method and an apparatus for carrying out the method. The method is an EB/PVD method for depositing heat insulation layers. A manipulator is not described.

EP 2 374 913 A1 likewise teaches a coating method and an apparatus for carrying out the method. The method is an EB/PVD method for depositing heat insulation layers. A coating chamber and a preheating chamber are provided. In the apparatus described there, a holder for workpieces is fastened to a manipulator. The manipulator can move the workpiece from an introducing chamber into the preheating chamber and the coating chamber. A rotational movement of the workpieces is thereby not possible.

EP 2 468 918 A2 relates to an apparatus for depositing coatings on workpieces. The apparatus has a multiplicity of holders which are suitable for receiving workpieces. The method which is carried out is an EB/PVD method. A manipulator is provided which is designed to be displaceable along its longitudinal axis and rotatable about the longitudinal axis. In this manner, the workpieces can be rotated in the coating chamber in order to obtain as uniform a coating as possible. With a special workpiece holder, the intention is to be able to coat even workpiece regions which are otherwise difficult to access.

EP 2 236 643 A2 also describes an EB/PVD apparatus for depositing coatings on workpieces. The movement of the workpiece during the coating is intended to be adjusted via a control unit. A manipulator is provided in order to move the workpiece forwards and back and to hold the latter in the coating chamber. For this purpose, the manipulator has a stem. The manipulator is furthermore suitable for setting the workpiece into rotation within the coating chamber. Further details regarding the manipulator are lacking.

The prior art solutions have the disadvantage that the manipulator in the region of the process zone is of complex design and is therefore susceptible to faults. The use of seals and movable components in that region of the manipulator which is located in the process zone during operation is also unfavourable. The drive and possibly present trolleys or rails for the manipulator are particularly fault prone. The drive of the manipulator is frequently arranged in the vacuum region, as a result of which not only is the service life of the apparatus reduced, but also the entire plant has to be designed to be larger. Since the EB/PVD method is carried out under vacuum, costs and apparatus outlay rise considerably with the size of the process chambers.

SUMMARY OF THE INVENTION

It is therefore an object of the present invention to provide an apparatus and a method with which coating of workpieces is possible with a reduced outlay on maintenance, reduced energy consumption and reduced apparatus outlay.

DETAILED DESCRIPTION OF THE INVENTION

Figure 1:
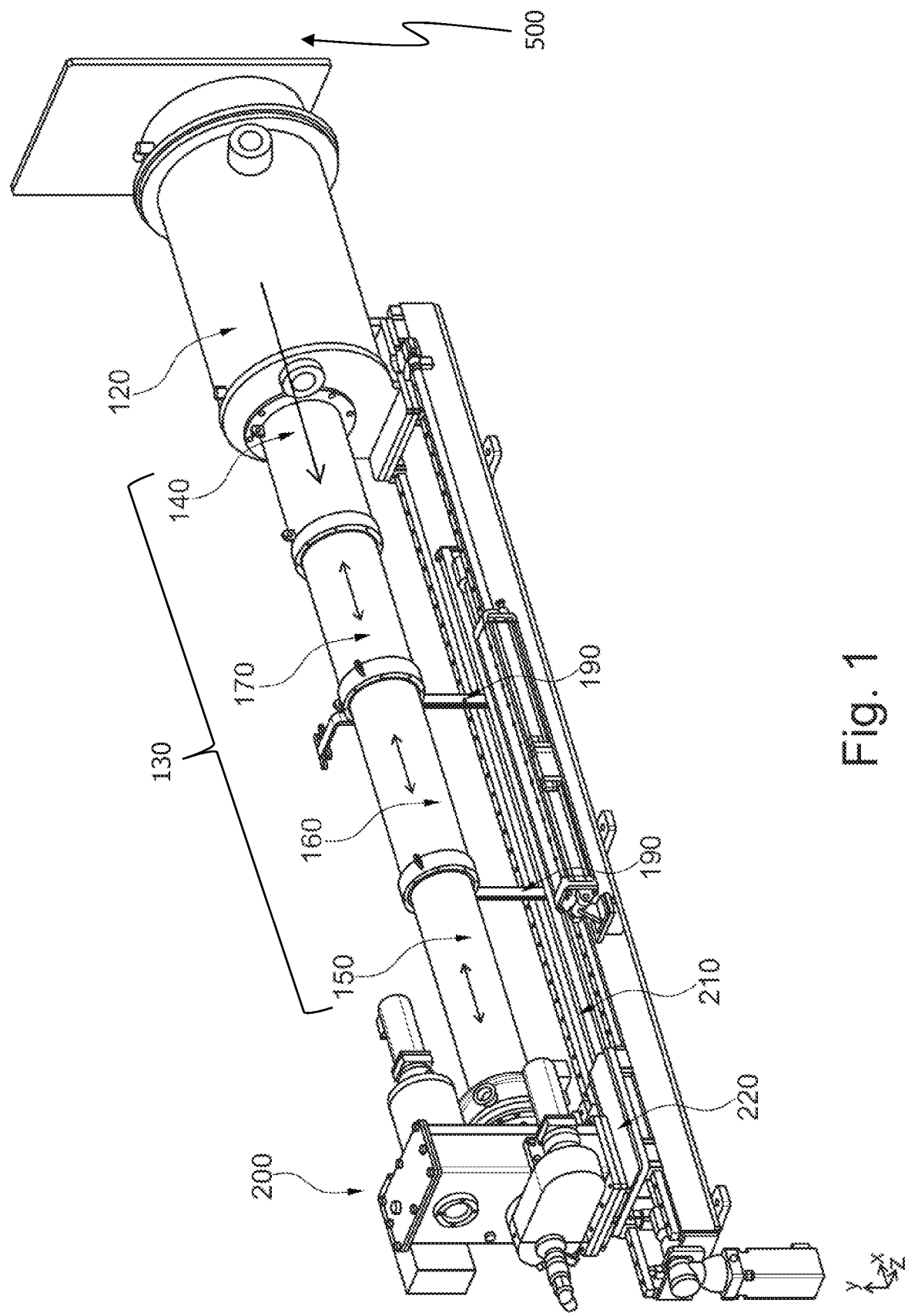
FIG. 1 shows an apparatus according to the invention with a total of four telescopic segments 150, 160, 170, 140, wherein the telescopic segment which is connected to the introducing chamber 120 is also referred to herein as a base segment 140. The telescopic segments are pushable into one another. The telescopic segment 170 is pushable into the base segment 140. The direction of the possible displacement is shown by arrows on the telescopic segments. The introducing chamber 120 and base segment 140 are displaceable together, symbolized by a common arrow. The manipulator (see FIG. 3) which has a shaft 320 which is connected to the drive unit 200 runs inside the telescopic segments. The drive unit 200 is located on a trolley 220 which is movable on guides, namely rails 210. The telescopic segments 160 and 170 are secured against twisting by anti-twist devices 190. The anti-twist devices 190 are connected between the telescopic segments and the rails 210. The apparatus has an introducing chamber 120 which is equipped with a duct 130, the constituent parts of which are the telescopic segments 150, 160 and 170 and the base segment 140. The duct 130 is located at an end of the introducing chamber 120 that faces away from the process zone 500. The introducing chamber 120 is movable on the rails 210 in order to be able to open and close an introducing opening which is arranged on the side facing the process zone 500 of the introducing chamber 120.
Figure 2:
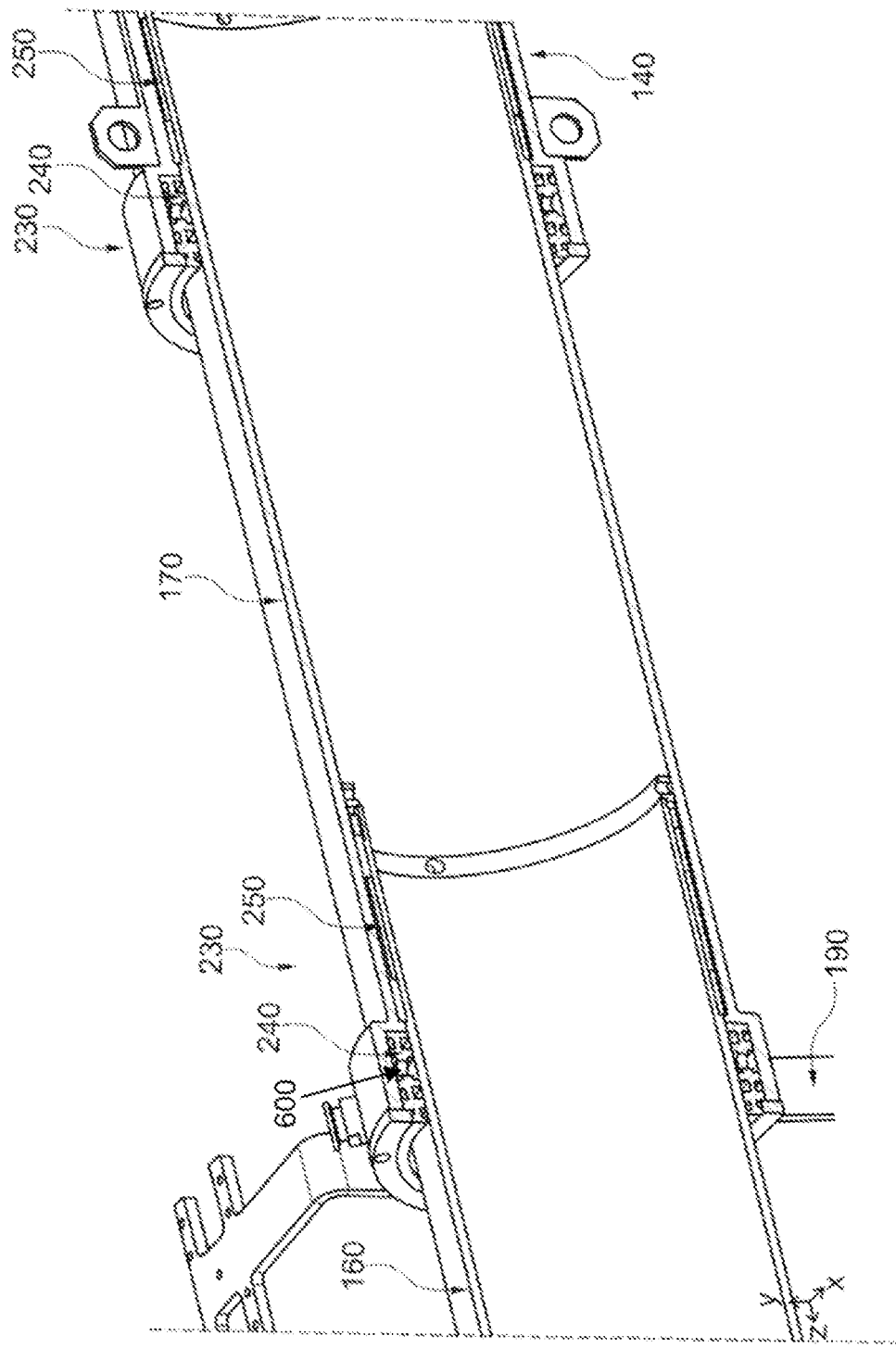
FIG. 2 shows a detailed view of telescopic segments 160, 170 used according to the invention and of the base segment 140. Intermediate regions 230 are formed between a section of the outer circumference of the respectively smaller telescopic segment 160, 170 and a section of the inner circumference of the adjacent larger telescopic segment 140 or base segment 140. Seals 240 and sliding guides 250 are arranged in the intermediate regions 230. An anti-twist device 190 can also be seen. The latter is preferably arranged, according to the invention, on the outer circumference of the larger telescopic segment lying opposite the seals 240.
Figure 3:
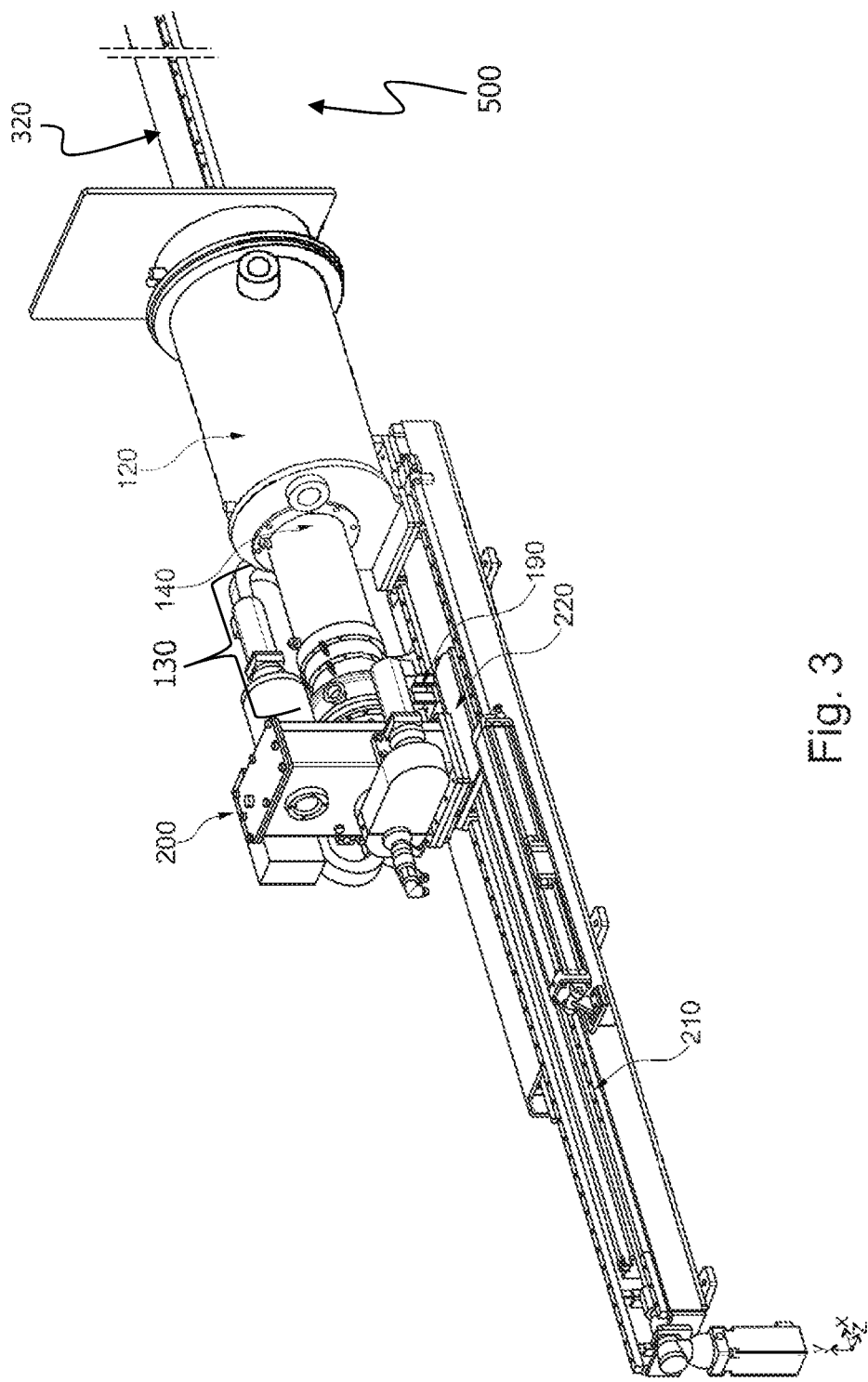
FIG. 3 shows an apparatus according to the invention with telescopic segments pushed into one another, wherein only the base segment 140 is visible. The manipulator (not shown) is pushed through the introducing chamber 120 into the process zone (not shown). The drive unit 200 is arranged on a trolley 220 which is movable on rails 210.

The object is achieved by the subject matter of the patent claims.

Apparatus

The object on which the invention is based is achieved by an apparatus for coating workpieces, in particular turbine blades, comprising at least one introducing chamber and at least one process zone 500, wherein the apparatus comprises at least one manipulator 310 with a holder 330 to which one or more workpieces can be fastened, wherein the holder 330 is at least partially movable, in particular rotatable about a longitudinal axis of the manipulator 310, wherein the manipulator is displaceable, in particular horizontally, in the direction of the longitudinal axis, and wherein the holder 330 is movable in the direction of the longitudinal axis of the manipulator 310 from the introducing chamber into the process zone 500. The manipulator 310 has a shaft 320 which is insertable into the introducing chamber and is suitable for setting the holder 330 and/or workpieces located thereon into movement, in particular into a rotational movement, wherein the introducing chamber has a duct 130 which is arranged on a side of the introducing chamber that faces away from the process zone 500, and wherein the duct 130 has at least two telescopic segments which are pushable into one another, and the shaft 320 runs through the telescopic segments, wherein a first telescopic segment has a smaller diameter than a second telescopic segment, wherein at least one seal is arranged in an intermediate region between a section of the outer circumference of the first telescopic segment and a section of the inner circumference of the second telescopic segment. The telescopic segments are arranged on the side of the duct 130 being positioned exterior of the introducing chamber and their area of motion extends predominantly outside of the introducing chamber. Predominantly means in the sense of the present application >50%, preferably >66%, >75%, in particular >95% and also includes 100%.

When reference is made in this description to "a workpiece", this expressly includes a plurality of workpieces. Customarily and preferably according to the invention, a plurality of workpieces are jointly fastened to the holder 330, and equally a plurality of workpieces are coated simultaneously in the method. The holder 330 is in particular suitable for holding at least 2, in particular at least 4, at least 6 or at least 8 workpieces. The number of workpieces is preferably limited to at most 24, in particular at most 20, at most 18 or at most 14. It has been shown that, in view of the customary dimensions of turbine blades and other workpieces which can be treated with the apparatus, these quantities of workpieces are particularly suitable for obtaining the greatest possible efficiency in a comparatively small apparatus.

The apparatus particularly advantageously has a plurality of introducing chambers 120, and therefore the capacity of the process zone 500 can be increased. In particular, each introducing chamber 120 is assigned a manipulator 310 and/or a duct 130 according to the invention with telescopic segments. While a coated workpiece is discharged, a further workpiece can already be introduced via a free introducing chamber. It is particularly advantageous to provide at least 2, at least 3 or at least 4 introducing chambers 120. Owing to the relatively small size of the introducing chambers used according to the invention in comparison to the prior art, a plurality of such chambers can be used in one apparatus. In a particularly preferred embodiment, a plurality of preheating zones (or preheating chambers) are provided, and therefore the efficiency can be increased further. Each introducing chamber 120 is preferably assigned a preheating zone (or preheating chamber). As a result, the throughput can once again be considerably increased.

Owing to this configuration, the apparatus of this invention can be designed to be relatively small. As a result of the fact that the shaft 320 runs through the telescopic segments, a drive unit for the shaft can be arranged outside the introducing chamber 120. This is particularly advantageous since the drive unit has a certain size and is equipped with sensitive components. By means of the particular configuration of the present invention, the drive unit can be arranged outside the zone where particularly high temperatures occur and dust arises. The configuration of the duct for the shaft 320 in the form of a telescopic duct which is located on a side of the introducing chamber that faces away from the process zone 500 and is telescoping towards the outside makes it possible for the seals and guides 210, 250 required for the telescopic duct to be arranged away as far as possible from the process zone 500 such that the wear is reduced and comparatively simple maintenance of said apparatus parts is made possible. Abrasive dust which impairs the service life of movable parts unavoidably arises in the process zone 500 of the apparatus. If fewer movable parts are arranged in the region affected by the abrasive dust, the outlay on maintenance in this respect will be lower. The apparatus according to the invention makes it possible to arrange sensitive parts, such as seals 240 in the intermediate region of the telescopic segments, guides 210, 250 of the telescopic segments, drive units and guides for the drive units, outside the process zone 500 and at a comparatively large distance from said zone of the greatest thermal and abrasive load. Furthermore, the apparatus according to the invention can have a relatively small vacuum region since the drive and trolley for the manipulator shaft can be arranged outside the chambers. A smaller vacuum pump therefore suffices for operating the apparatus.

The manipulator 310 has at least the shaft 320 and the holder 330. The manipulator can have more than one shaft, wherein the shafts preferably run coaxially. The holder 330 can have more than one holding arm. It is thus conceivable in particular for the holder to be divided into two or more holding arms at which measures can be provided in each case for holding one or more workpieces (e.g. holding pins). The workpieces can be rotatable about their own axis on the holder in order to achieve as uniform a coating as possible. Furthermore, the holder 330 can be rotatable about the longitudinal axis of the shaft(s). Further movement patterns of the holder, leading to a more uniform coating of the workpieces, are also in accordance with the invention.

In one embodiment, the apparatus comprises a preheating zone. The preheating zone serves for preheating the workpieces. It is preferably arranged between the introducing chamber 120 and the process zone 500. In the method, first of all at least one workpiece which is to be treated is therefore inserted into the introducing chamber and fastened to the holder 330. After closing the introducing chamber in the direction of the surroundings, said introducing chamber can be evacuated. The workpiece can then be moved into the preheating zone in order to preheat the workpiece to an increased temperature. The workpiece can be moved from the preheating zone into the process zone 500 in order to be coated. After the coating, the coated workpiece can be moved back out of the process zone into the introducing chamber which can also serve for discharging the coated workpieces.

The preheating zone and/or the process zone are preferably configured as gas tight chambers. The introducing chamber is preferably configured as gas tight chamber. In one embodiment of the invention, an opening, which is closable in a gas tight manner, for the passage of workpieces fastened to the holder is provided between the introducing chamber and process zone or process chamber. In one embodiment which, in addition to the introducing chamber and the process zone or process chamber, also has a preheating zone or preheating chamber, an opening, which is closable in a gas tight manner, for the passage of workpieces fastened to the holder is preferably provided between the introducing chamber and preheating zone and/or between the preheating zone and process zone.

According to the invention, "chamber" means that that part of the apparatus which is referred to in such a manner has at least one delimitation in all directions in space. Said delimitation can consist in a closed wall, or the wall can have one or more openings. The openings can be closable, in particular closable in a gas tight manner. The chambers and in particular the entire apparatus are preferably gas tight in the closed state. Within the context of the present invention, "gas tight" means that the volume leakage rate in a space referred to as "gas tight" (e.g. a process chamber), or at a closed opening or seal referred to as "gas tight" is less than $1*10-2$ mbar*l/s, in particular less than $5*10-3$ mbar*l/s. The volume leakage rate is preferably measured at 20° C. and an ambient pressure of 1013 hPa.

It is not ruled out that the chambers have further openings which are not expressly mentioned here. Said openings are closable towards the surroundings in the case of gas tight chambers. In particular, the introducing chamber has at least one closable introducing opening through which workpieces can be inserted into the introducing chamber. Coated workpieces can be removed again from the apparatus through the same opening or a further closable opening.

In one embodiment, the introducing opening of the introducing chamber is located on that side of the introducing chamber which faces the process zone. In such an embodiment, the introducing chamber is preferably displaceable, in particular in the direction of the longitudinal axis of the manipulator. The introducing opening is then opened in particular by displacement of the introducing chamber along the longitudinal axis of the manipulator in the direction of the telescopic segments, 140, 150, 160, and 170, and therefore the telescopic segments are at least partially pushed into one another and the holder is exposed. In order to close the introducing opening, the introducing chamber is pushed back in the direction of the process zone via the holder, and therefore the introducing chamber is closed again in a gas tight manner. The holder is in particular not moved during the opening and closing of the introducing chamber (introducing position). The outer wall of a preheating and process chamber can in particular have a seal in order to close the introducing opening in a gas tight manner. The introducing chamber can be movable, in particular on rails, for example on the same rails as the drive unit.

The introducing chamber furthermore preferably has a closable opening to the process zone or to the preheating zone. The preheating zone, if it is configured as a chamber, preferably has at least one opening to the introducing chamber and at least one opening to the process zone. One opening or both of the openings can be closable in a gas tight manner; preferably, the opening to the introducing chamber is closable in a gas tight manner since ambient pressure can temporarily prevail in the introducing chamber. The process zone, if it is configured as a chamber, can have a closable opening to the introducing chamber and/or to the preheating zone, if present. Furthermore, the process chamber can have further openings; in particular, closable openings can be provided in order to insert material sources, in particular ingots, from the coating material. Furthermore, one or more of the chambers, in particular introducing and/or process chambers, can have extraction openings in order to connect one or more vacuum pumps.

In one embodiment of the invention, the duct has at least 3, preferably at least 4 and particularly preferably at least 5 telescopic segments. According to the invention, the number of telescopic segments is preferably limited to at most 12, more preferably to at most 8 and particularly preferably to at most 6 telescopic segments. If too great a number of telescopic segments is used, the number of sealing points and the diameter of the duct increase, which is disadvantageous. The features described herein of the telescopic segments in respect of the intermediate regions 230, intermediate extractors 600, seals 240, anti-twist devices 190 and/or guides 210, 250 preferably relate, according to the invention, to a plurality of, in particular to all of the telescopic segments.

The duct preferably has one or more anti twist devices in order to avoid twisting of the telescopic segments. The anti-twist device can consist in a connecting piece between a section of the outer circumference of a telescopic segment and a guide 210, 250, in particular a guide rail. The connecting piece is displaceable here on the rail, and therefore said connecting piece is movable with the telescopic segments along the longitudinal axis. Twisting of the telescopic segments and preferably also excessive mechanical stressing of the telescopic segments and sliding guides are therefore avoided.

The seal arranged in the intermediate region can consist in one or more sealing elements, such as in particular sealing rings (e.g. 0 rings or quad rings). Two sealing elements can form a seal intermediate space. In the intermediate region mentioned, the apparatus can have an extractor in order to obtain a negative pressure in the seal intermediate space. The seal can in particular have at least two sealing rings which are arranged spaced apart from each other in the intermediate region and form at least one intermediate space. A negative pressure can be set in the intermediate space using the extractor. This has the advantage that the penetration of ambient air is effectively avoided even in the event of cracks or scratches.

A guide 210, 250, in particular sliding guide, can in particular also be provided in the intermediate region in order to support the displaceability of the telescopic segments in one another and in order to ensure an unobstructed pushing or sliding in one another. The guide comprises at least one guide inner element on the outer circumference of the telescopic segment with the smaller diameter and at least one guide outer element on the inner circumference of the telescopic segment with the larger diameter. The guide inner element preferably extends over a length of at least 50%, more preferably at least 70% and furthermore preferably at least 90% of the length of the telescopic segment, to which the element is fastened, in the direction of the longitudinal axis of the manipulator. Consequently, in an extended state, part, in particular a large part (>50%), of the guide inner element can be arranged outside the intermediate region. It is thus ensured that the telescopic segments are pushable into one another over a great length, with the result that the manipulator can be pushed to a great extent into the inner region of the apparatus. Suitable guide elements can be any guides familiar to a person skilled in the art, in particular sliding guides. Each telescopic segment preferably has at least one guide, in particular at least two guides.

According to the invention, "first telescopic segment" refers to the segment with the smallest cross-sectional diameter in comparison to the other telescopic segments. According to the invention, the "largest telescopic segment" refers to the segment with the largest cross-sectional diameter in comparison to the other telescopic segments. The telescopic segment which is connected to the introducing chamber is also referred to herein as a "base segment". In one embodiment, the first telescopic segment is connected to the drive unit. In another embodiment, the largest telescopic segment is connected to the drive unit. The connection is preferably of gas tight design. It is undertaken in particular via flanges. The telescopic segments together form an outwardly closed space inside the duct. The telescopic segments have openings along the longitudinal axis of the manipulator, permitting at least the shaft to be guided through. The openings can also be larger, particularly since seals are not required in this region. The telescopic segments can have circular cross sections, and therefore "tubular segments" can be referred to. Alternatively, the cross sections can also be rectangular, polygonal or of any other shape as long as the shapes of the respectively adjacent segments are coordinated with one another. The telescopic segments are preferably provided with openings only in the direction of the longitudinal axis of the manipulator and are otherwise of closed design, i.e. in the region of the lateral surfaces. If, however, openings are provided, they are closable in a gas tight manner.

The expression that at least "two telescopic segments which are pushable into one another" are provided means that one of the two telescopic segments, namely the segment with the smaller diameter, can be at least partially pushed (in particular by at least 50%, at least 70% or at least 90% of the length of the smaller telescopic segment) into the other telescopic segment. Each telescopic segment which is inserted according to the invention is preferably pushable into another telescopic segment, with the exception of the largest telescopic segment. A telescopic segment can be pushable into the base segment which is arranged on the introducing chamber. The base segment then of course has a larger diameter than the telescopic segment which is pushable into the base segment. The base segment itself is in particular not pushable into a further telescopic segment. The base segment is preferably fixedly connected, e.g. with a flange, to the introducing chamber. The sum of the lengths of the telescopic segments is at least as large as the distance between an introducing position in the introducing chamber, at which the holder of the manipulator is located during the introducing of workpieces, and a coating position in the process zone, at which the holder of the manipulator is located during the coating.

The drive unit is in particular movable along the longitudinal axis of the manipulator. The movability can preferably be achieved by means of guides which run parallel to and in particular below the longitudinal axis of the manipulator. The guides 250 can be in particular rails 210, and/or the drive unit 200 can be movable on the guides on a trolley 220. The introducing chamber, if it is likewise movable, can likewise be arranged movably on guides, in particular on the same guides as the drive unit.

Method

According to the invention, a method is also provided for coating workpieces, in particular turbine blades, with the steps: inserting one or more workpieces into the introducing chamber of an apparatus according to the present invention and fastening the workpiece to the holder, or inserting one or more workpieces, which are fastened to a holder, into the introducing chamber of an apparatus of the present invention and fastening the holder to the manipulator, moving the workpiece by means of a manipulator from the introducing chamber into the process zone or into a preheating zone and subsequently into the process zone, coating the workpiece in the process zone, and removing the coated workpiece from the apparatus, wherein during the movement of the workpiece into the process zone, or into a preheating zone and subsequently into the process zone, the telescopic segments are pushed into one another.

The coating which is applied in the method according to the invention is preferably a heat insulation coating which in particular comprises $Y_2O_3$-stabilized $ZrO_2$, mullite, $Al_2O_3$, $CeO_2$, rare earth zirconates, rare earth oxides and/or metal/glass composite materials, or is composed thereof. The coating material preferably comprises $Y_2O_3$-stabilized $ZrO_2$, $Gd_2O_3$, $Yb_2O_3$ and/or $Nd_2O_3$, and in particular the coating material is composed thereof. In one embodiment, the coating material can comprise metals or metal alloys or can be composed thereof; in particular these are metals or metal alloys based on nickel, chromium and/or cobalt, such as in particular NiCoCrAlY.

The method furthermore preferably comprises the inserting and at least partial evaporating of a material source, in particular an ingot of the coating material.

The coating preferably takes place under vacuum, in particular at a pressure of <50 Pa, <40 Pa, <30 Pa, <20 Pa or less than <10 Pa. The coating preferably takes place at a temperature of at least 800° C., in particular at least 850° C. or at least 900° C. The temperature should preferably not exceed a value of 1250° C., 1200° C. or 1100° C.

A more detailed method sequence according to a preferred embodiment proceeds as follows, wherein each method step presented in this preferred embodiment taken by itself in combination with the subject matter below constitutes an independent preferred refinement of the method according to the invention.

Inserting one or more workpieces into the introducing chamber of an apparatus according to the present invention and fastening the workpiece to the holder, or inserting a workpiece, which is fastened to a holder, into the introducing chamber of an apparatus according to the present invention and fastening the holder to the manipulator, closing the closable introducing opening of the introducing chamber, evacuating the introducing chamber, opening a closable opening between the introducing chamber and preheating zone, or between the introducing chamber and process zone, moving the workpiece, which is fastened to the manipulator, from the introducing chamber into the process zone, or into the preheating zone and subsequently into the process zone by pushing the telescopic segments into one another, rotating the workpiece on the manipulator in the process zone while coating the workpiece in the process zone, retracting the coated workpiece fastened to the manipulator out of the process zone back into the introducing chamber with the telescopic segments being extended, closing a closable opening between the introducing chamber and preheating zone, or between the introducing chamber and process zone, opening the closable introducing opening or discharge opening of the introducing chamber, and removing the coated workpiece from the apparatus.

LIST OF REFERENCE SIGNS

120 Introducing chamber
130 Duct
140 Base segment
150 First telescopic segment
160 Second telescopic segment
170 Third telescopic segment
190 Anti twist device
200 Drive unit
210 Rails
220 Trolley
230 Intermediate region
240 Seal
250 Sliding guide
320 Shaft
500 Process zone

What is claimed is:
1. An apparatus for coating workpieces, comprising:
at least one introducing chamber;
at least one process zone;
at least one manipulator displaceable in the direction of its longitudinal axis, each manipulator further comprising a shaft capable of holding and inserting a workpiece substrate into the at least one introducing chamber;
wherein the at least one introducing chamber further comprises a duct located on a side of the at least one introducing chamber that faces away from the process zone, the duct further comprising at least two telescopic segments that are pushable into one another;
wherein a first telescopic segment has a smaller diameter than a second telescopic segment, and at least one seal located in an intermediate region between a section of the outer circumference of the first telescopic segment and a section of the inner circumference of the second telescopic segment;
wherein the seal comprises a plurality of sealing rings adapted to prevent a penetration of ambient air into the duct;
wherein one of the at least two telescopic segments is a base segment and is connected to the introducing chamber;
wherein the seal comprises a plurality of sealing rings;
wherein the shaft runs through the telescopic segments;
wherein the sum of lengths of the at least two telescopic segments is at least as large as the distance between an introducing position in the at least one introducing chamber and a coating position in the at least one process zone,
wherein each of the at least two telescopic segments is associated with at least one of the at least one seal such that a seal is located between a respective pair of telescopic segments for all pairs of telescopic segments of the apparatus.

2. The apparatus according to claim 1, comprising a plurality of introducing chambers, each of which receives the corresponding shaft capable of holding and inserting a workpiece substrate and a duct with telescopic segments.

3. The apparatus according to claim 1, wherein the duct has at least 3, and at most 12, telescopic segments.

4. The apparatus according to claim 3, wherein the duct has at least 4, and at most 8, telescopic segments.

5. The apparatus according to claim 3 wherein the duct has at least 5, and at most 6 telescopic segments.

6. The apparatus according to claim 1, further comprising an extractor located between two sealing elements in the intermediate region.

7. The apparatus according to claim 1, further comprising at least one sliding guide located in the intermediate region that supports the displaceability of the at least two telescopic segments on one another.

8. The apparatus according to claim 1, wherein the at least one seal extends circumferentially about the intermediate region between the first telescopic segment and the second telescopic segment.

* * * * *